(12) United States Patent
Sato et al.

(10) Patent No.: US 6,249,042 B1
(45) Date of Patent: Jun. 19, 2001

(54) MEMBER FOR LEAD

(75) Inventors: Shin Sato; Keiichi Tanaka, both of Kanuma; Takehiro Hosokawa, Osaka, all of (JP)

(73) Assignee: Sumitomo Electric Industries LTD, Osaka (JP)

( * ) Notice: Subject to any disclaimer, the term of this patent is extended or adjusted under 35 U.S.C. 154(b) by 0 days.

(21) Appl. No.: 09/403,831

(22) PCT Filed: Feb. 12, 1999

(86) PCT No.: PCT/JP99/00629

§ 371 Date: Oct. 27, 1999

§ 102(e) Date: Oct. 27, 1999

(87) PCT Pub. No.: WO99/66553

PCT Pub. Date: Dec. 23, 1999

(30) Foreign Application Priority Data

Jun. 19, 1998 (JP) .................................................. 10-172497

(51) Int. Cl.[7] .................................................. H01L 23/495
(52) U.S. Cl. .......................... 257/666; 257/668; 257/669; 257/692; 438/106; 438/111; 438/123
(58) Field of Search ...................................... 257/690, 692, 257/962, 668, 666, 667, 669; 438/111, 123; 174/52.2, 52.3, 52.4; 29/825, 827, 874, 882

(56) References Cited

U.S. PATENT DOCUMENTS

| | | | | |
|---|---|---|---|---|
| 4,012,835 | * | 3/1977 | Wallick | 29/591 |
| 4,862,245 | * | 8/1989 | Pashby et al. | 257/660 |
| 5,198,391 | * | 3/1993 | Rosel et al. | 29/827 |
| 5,408,050 | * | 4/1995 | Kashio et al. | 174/117 F |
| 5,594,234 | * | 1/1997 | Carter, Jr. et al. | 257/676 |
| 5,716,218 | * | 2/1998 | Farnworth et al. | 438/15 |
| 6,081,031 | * | 6/2000 | Letterman, Jr. et al. | 257/730 |

* cited by examiner

*Primary Examiner*—Matthew Smith
*Assistant Examiner*—Craig P Lytle
(74) *Attorney, Agent, or Firm*—Smith, Gambrell & Russell, LLP

(57) ABSTRACT

A lead member includes a plurality of conductors arranged in parallel and an insulating film fixing the conductors at a predetermined pitch. Each conductor includes a first end portion, a second end portion, and a flat portion extending between the first and second end portions. The flat portion is located on a plane different from a plane on which the first end portion and the second end portion lie. The flat portion may be formed by bending the lead member along a bent line such that the bent line is kept straight. Preferably, each conductor includes a narrow portion and a wide portion, wherein a width of each conductor along the bent line is greater than half of the pitch between adjacent conductors.

3 Claims, 2 Drawing Sheets

MEMBER FOR LEAD

TECHNICAL FIELD

The present application relates to a lead member for use in connection of circuits and the like for electronic apparatuses. The invention provides a lead member readily usable in suction-transportation processes and suitable for automatic mounting processes.

BACKGROUND ART

Because of increasing demands for smaller and lighter electronic apparatuses and the like in recent years, lead members for use in connection of circuits and the like having good space factors are being demanded. As a result, lead members of the type that have a plurality of flat conductors arranged in parallel and fixed by an insulating material at a predetermined pitch have come to be widely used.

Meanwhile, in the field of mounting devices on electronic apparatuses and the like, demands for adaptation to automation and rationalization are increasing. However, lead members of the above described type for use in interconnection of circuits and the like are thin, and hence are liable to bend and curl. Therefore, errors are liable to occur during suction-transportation of them, and there has been a problem that they are not suitable for automatic mounting.

DISCLOSURE OF THE INVENTION

The inventors made investigations into various ways to obtain lead members which, while keeping a good space factor, are easy to use in suction-transportation processes and are suitable for automatic mounting. As a result of these investigations, the inventors found that a suitable lead member having a plurality of flat conductors arranged in parallel and fixed by an insulating film at a predetermined pitch, that is readily used in suction-transportation and suitable for automatic mounting, can be obtained by providing the lead member with a flat portion for suction-transportation at a different position from the plane including both end portions of the flat conductors. Such lead members can be obtained, for example, by bending the flat conductors at predetermined positions where the flat conductors have a predetermined width such that the bent lines are kept straight.

Figure 1:
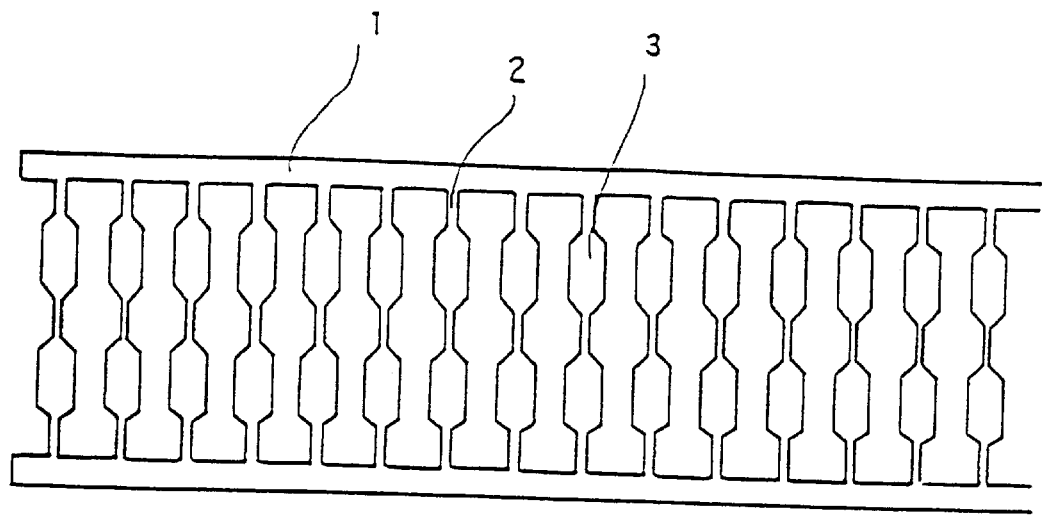
FIG. 1 illustrates a lead pattern produced by punching.

Reference numeral 1 denotes a carrier portion, 2 denotes a narrow portion of a flat conductor, 3 denotes a wide portion of the flat conductor, 4 denotes an insulating layer, 5 denotes a bent line (inwardly bent), 6 denotes a bent line (outwardly bent), and 7 denotes a flat portion for suction-transportation.

BEST MODE FOR CARRYING OUT THE INVENTION

First, using a hard copper foil having a width of 50 mm and a thickness of 0.15 mm, a lead pattern having a carrier portion 1 as shown in FIG. 1 was produced by punching. The flat conductors of the lead pattern are arranged at a pitch of 0.94 mm, and each flat conductor is provided with a narrow portion 2 and a wide portion 3, the narrow portion having a width of 0.25 mm and the wide portion having a width of 0.5 mm.

Figure 2:
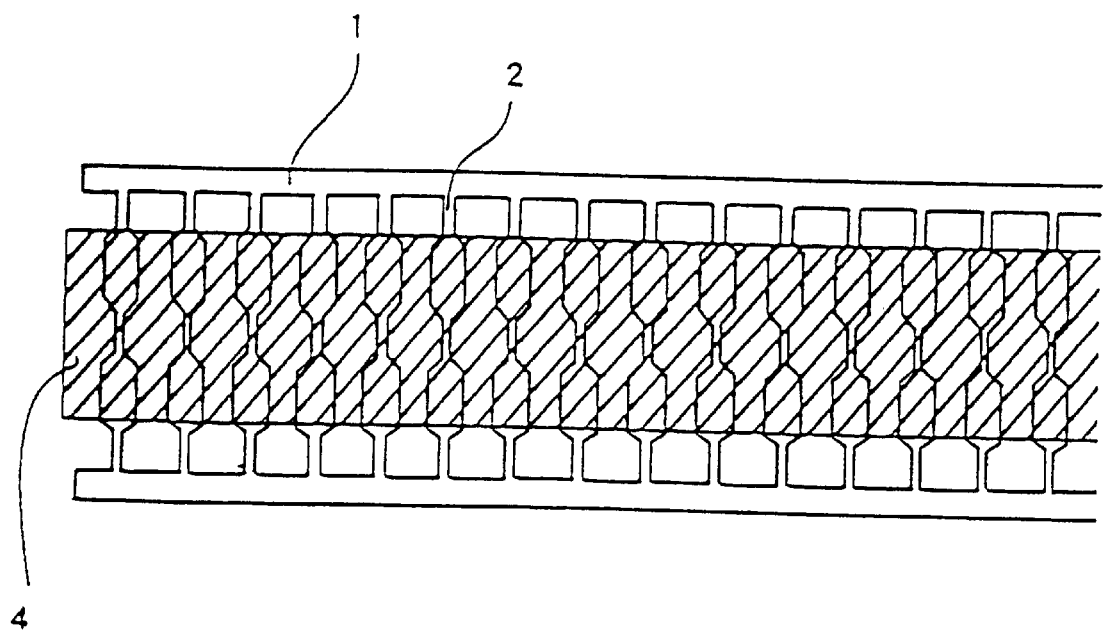
FIG. 2 shows a lead pattern laminated with insulating films on both surfaces thereof

Then, two sheets of polyimide film 4 having a thickness of 25 $\mu$m and a width of 30 mm were coated with an epoxy resin adhesive to a thickness of 50 $\mu$m. The center portion of the flat conductors was laminated with the films 4 with the adhesive coated sides of the films 4 on the inside in a sandwiched manner as shown in FIG. 2, and then the adhesive was hardened.

Figure 3:
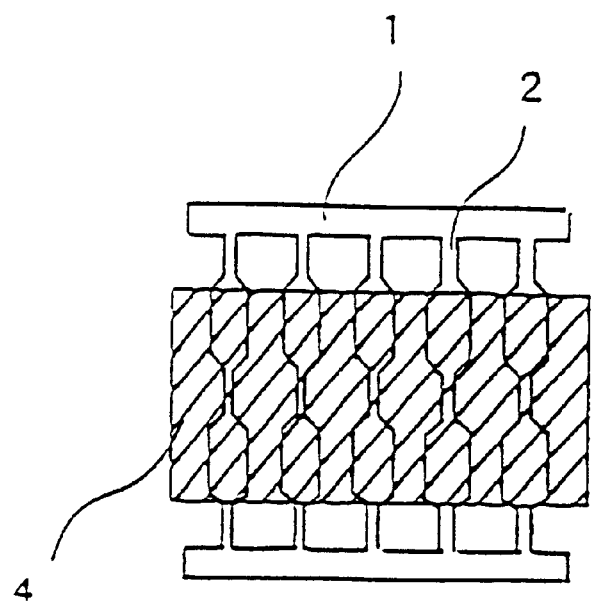
FIG. 3 shows a cut lead member piece having a five-pitch portion of flat conductors.

The thus obtained laminated article was cut into pieces, each piece thereof having a five-pitch portion of the flat conductors as shown in FIG. 3.

Figure 4:
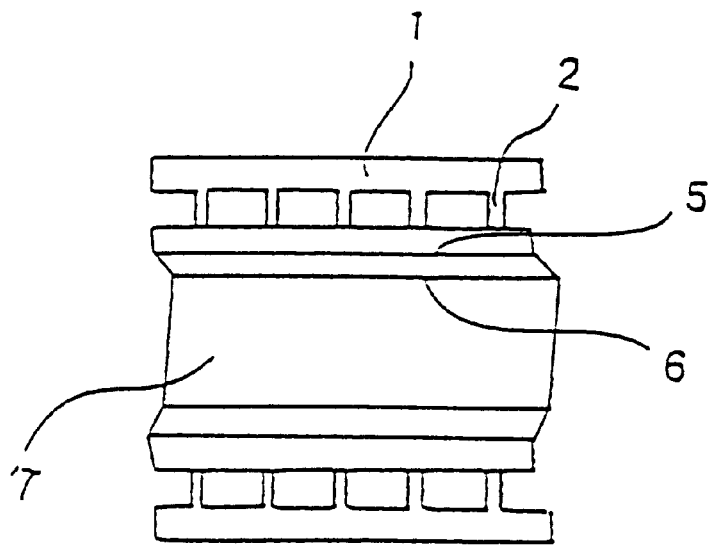
FIG. 4 illustrates a lead member according to the invention provided with a flat portion for suction-transportation produced by bending.

Then, the member so cut as to have a 5-pitch portion was bent, along a metallic die, at its portion having wide flat conductors such that both bent lines (inward bent line 5 and outward bent line 6) were kept straight as shown in FIG. 4. In this manner, the flat portion for suction-transportation 7 was formed as a plane at a different position from the plane including the carriers 1 and the adjoining portions having the narrow flat conductors 2 (as shown in FIG. 4, the carriers 1 and narrow flat conductors 2 are located at both ends of the flat portion 7).

If a flat portion for suction-transportation 7 as shown in the above embodiment is not provided, because the lead member is formed of a thin material (e.g., less than 1 mm), there is a problem that, even if one attempts to secure flatness by pressing or the like, the lead member tends to bend or curl during the handling that follows.

On the other hand, in the case of the lead member according to the invention, because the flat portion for suction-transportation 7 is formed by bending the product such that the bent lines are kept straight, a lead member free from curling can be obtained as the flat portion. Further, because this flatness is secured by the bent lines and the lead member is hardly bendable in the direction of the bent lines, the product, after its completion, has such characteristic features that it hardly produces bending, curling, and the like during the handling that follows.

Further, because the flat portion for suction-transportation 7 of the embodiment according to the invention is formed as a plane at a different position from the plane including both end portions of the flat conductors, the flat portion for suction-transportation 7 is elevated several mm above the plane on which the lead member is placed (e.g., a board or the like), when both end portions of the flat conductors are placed on a plane formed on a board or the like.

Because the flat portion for suction-transportation 7 is held at a predetermined elevation and its flatness is secured as described above, suction-transportation of the product can be made easy and free from transportation errors, thereby making automatic mounting thereof possible.

Further, it was confirmed that the lead member according to the invention allows soldering in automatic mounting to be carried out without any problem. Furthermore, it was easy to cut off the carrier after soldering.

Although, an example was described above in which the lead members were soldered up with the carriers left on both sides of the flat conductors, it is also possible to have the carrier portions cut off before automatic mounting is made.

Further, without bending the lead member itself, the same effect can be obtained by laminating a flat lead member with an article made of aluminum foil or the like bent into a shape like the lead member in the embodiment described above.

When the end portion of the flat conductor is soldered in an automatic mounting process, a problem arises with the ratio between the width of the flat conductor and the pitch between the flat conductors. Namely, when the width of the flat conductor comes closer to the pitch between the flat conductors, solder bridges causing trouble tend to occur between adjoining conductors. To prevent such bridges from being produced, it is preferred generally that the width of the end portion of the flat conductor subjected to soldering be defined to be one third of the pitch or less.

While it is desired that the width of the flat conductor at its end portion be made small, if the widths of the flat conductors are all together made to have such a small width, the strength along the bent line may become insufficient. In other words, the advantageous effect of the invention is canceled and bends and curls are produced and, in some cases, erroneous suction-transportation can occur.

If the portions of reduced width at the end portion are made longer for the sake of soldering, such a problem arises that the conductor tends to bend. To prevent occurrence of such bending of the conductor, it is preferred that the portion of the conductor narrowed in the vicinity of the end be made as short as possible provided that soldering can be accomplished, and, further, it is preferred that the wide portions be provided such that adjoining conductors do not come into contact with each other and the bent lines are made in the wide portion. Thus, by making the width of each of the plurality of the flat conductors at the portions along the bent lines greater than the pitch between the conductors, a sufficient strength is obtained along the bent line, bends and curls are prevented from being produced in the flat portion for suction-transportation, and, thereby, occurrence of erroneous suction-transportation can be prevented.

As described in the foregoing, in the invention of the present application, a flat conductor is provided with a wide portion and a narrow portion, and the flat conductors are bent at the wide portion and, hence, favorable results as described in the foregoing embodiments can be obtained.

We claim:

1. A lead member, comprising:
   a plurality of conductors arranged in parallel, wherein each conductor includes a first end portion, a second end portion, and a flat portion extending between the first end portion and the second end portion, wherein the flat portion is located on a plane different from a plane on which the first end portion and the second end portion lie; and
   an insulating film fixing the conductors at a predetermined pitch.

2. A lead member according to claim 1, wherein the flat portion is formed by bending said lead member along a bent line such that the bent line is kept straight.

3. A lead member according to claim 2, wherein each conductor includes a narrow portion and a wide portion, and wherein a width of each conductor along the bent line is greater than half of the pitch between adjacent conductors.

* * * * *